United States Patent [19]

Park

[11] Patent Number: 5,296,399

[45] Date of Patent: Mar. 22, 1994

[54] METHOD FOR MANUFACTURING A NARROWED SIDEWALL SPACER IN A PERIPHERAL CIRCUIT OF A ULSI SEMICONDUCTOR MEMORY DEVICE

[75] Inventor: Young-woo Park, Suwon, Rep. of Korea

[73] Assignee: Samsung Electronics Co., Ltd., Suwon, Rep. of Korea

[21] Appl. No.: 966,899

[22] Filed: Oct. 26, 1992

Related U.S. Application Data

[63] Continuation of Ser. No. 783,341, Oct. 28, 1991, abandoned.

[30] Foreign Application Priority Data

Apr. 24, 1991 [KR] Rep. of Korea .................... 91-6580

[51] Int. Cl.⁵ .................... H01L 21/70; H01L 27/00
[52] U.S. Cl. ................................ 437/52; 437/48; 437/60; 437/919
[58] Field of Search ................ 437/52, 60, 919, 48

[56] References Cited

U.S. PATENT DOCUMENTS 4,426,764  11/1984  Kosa et al. ................ 437/43
4,882,289  11/1989  Moriuchi et al. .
4,984,200   1/1991  Saitoo et al. .
5,025,295   6/1991  Kuestars et al. .
5,028,990   7/1991  Kotaki et al. ............. 437/52
5,063,431  11/1991  Ushima .

Primary Examiner—Olik Chaudhuri
Assistant Examiner—H. Jey Tsai
Attorney, Agent, or Firm—Cushman, Darby & Cushman

[57] ABSTRACT

A method for manufacturing ULSI semiconductor memory devices is disclosed which uses an insulating film to form a side wall spacer of the gate electrodes of transistors formed in the peripheral circuit section of a memory device. This scheme prevents surface deterioration of the underlying structure during an etching process for manufacturing of a cell capacitor of a memory cell device cell array portion. The insulating film includes a laminated film composed of a thin oxide film and an etch blocking film formed on the oxide film. Due to the etch blocking film, the oxide film can be made thin, resulting in the formation of side wall spacers that are appropriately narrow. Thus, the function and operating speed of the peripheral circuit transistors is improved.

10 Claims, 3 Drawing Sheets

METHOD FOR MANUFACTURING A NARROWED SIDEWALL SPACER IN A PERIPHERAL CIRCUIT OF A ULSI SEMICONDUCTOR MEMORY DEVICE

This is a continuation of application Ser. No. 07/783,341, filed on Oct. 28, 1991, now abandoned.

BACKGROUND OF THE INVENTION

1. Field of the Invention

The present invention relates to a method for manufacturing an ultra-large-scale integrated (ULSI) semiconductor memory device, and more particularly to a method for manufacturing a ULSI semiconductor memory device which can improve the performance of transistors of the peripheral circuit section.

2. Description of Related Art

As VLSI has become more integrated, 16 Mbit DRAMs have been mass-produced and new products related to 64 Mbit DRAMs have been presented. Such ULSI semiconductor memory devices require junctions which are as thin as possible and must take into consideration short-channel and hot-carrier effects, punch-through, the increase in breakdown voltage, etc., of a MOS transistor. If, on the other hand, the spacers formed on the side walls of the gate electrodes are wide, these thin junctions diffuse a short distance laterally, reducing the extent to which they are overlapped by the gate electrode, and therefore noticeably reducing the transistor's saturation drain current.

Accordingly, to control the width of a side wall spacer as desired, the thickness of a high temperature oxide (HTO) film which forms the side wall spacer should be controlled. However, since the HTO film is also used as a buffer layer for preventing silicon pitting during cell array capacitor formation, the thickness cannot be too thin.

That is, since the HTO film of the cell array is used to form side wall spacers for the transistors of the peripheral circuit section, the reduction of the width of the HTO-film side wall spacers is limited. This deteriorates the current driving capability of peripheral circuit transistors.

Referring to FIG. 1, in a NMOS transistor of lightly doped drain (LDD) structure, as length L1 of side wall spacer 1 increases, and in so doing, increasing length L2 of $n^-$ impurity-doped region 2, the resistance of region 2 increases. Accordingly, the drain saturation current is reduced. At the same time, increasing the dosage of the $n^-$ impurity to increase the drain saturation current does not sufficiently utilize the advantages of shallow junction $xj1$ since this would deteriorate punch-through tolerance.

Referring to FIG. 2, in a PMOS transistor of single drain structure, as length L1 of side wall spacer 3 increases, length L3 (with respect to $p^+$ impurity-doped region 4 and gate electrode layer 5) increases. This also reduces drain saturation current. To increase the drain saturation current requires a complicated structure, such as an LDD structure, even in a PMOS transistor, the process becomes complex.

SUMMARY OF THE INVENTION

It is an object of the present invention to provide a method for manufacturing a ULSI semiconductor memory device wherein the side wall spacers of the transistors of the peripheral circuit section are narrowed, while still preventing the pitting problem of the cell array in order to solve the problems of conventional technique.

It is another object of the present invention to provide a method for manufacturing a ULSI semiconductor memory device which improves the performance of transistors of the peripheral circuit section.

To achieve the above objects, the present method for manufacturing a ULSI semiconductor device is formed with an insulating film for preventing the surface deterioration of the lower structure resulting from the etching process during the manufacturing of the cell array capacitors. The insulating film also constitute a side wall spacer of the gate electrode of transistors formed in the peripheral circuit section. The insulating film is formed of a laminated film which is an oxide film, and of an etch blocking film formed thereon.

BRIEF DESCRIPTION OF THE DRAWINGS

The above objects and other advantages of the present invention will become more apparent by describing the preferred embodiment of the present invention with reference to the attached drawings, in which.

DETAILED DESCRIPTION OF THE INVENTION

The present invention will be described with reference to the accompanying drawings.

First of all, to easily understand the present fabrication method, the conventional fabrication method is described with reference to FIGS. 3A to 3C as follows.

Figure 1:
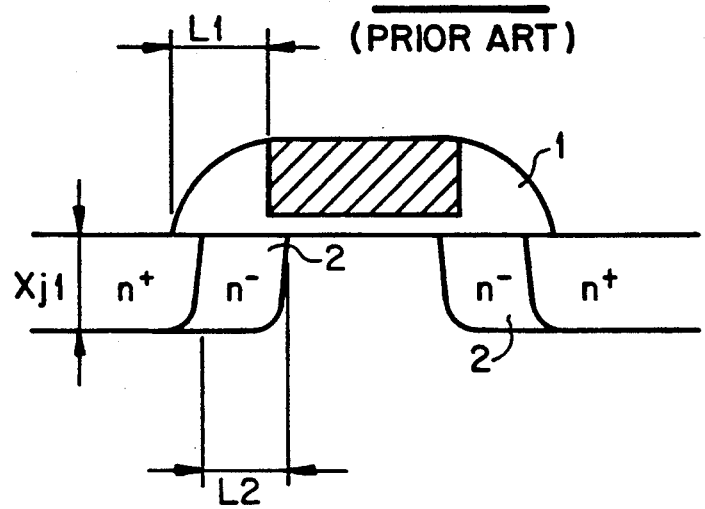
FIG. 1 is a schematic view showing the structure of a NMOS transistor of LDD structure.
Figure 2:
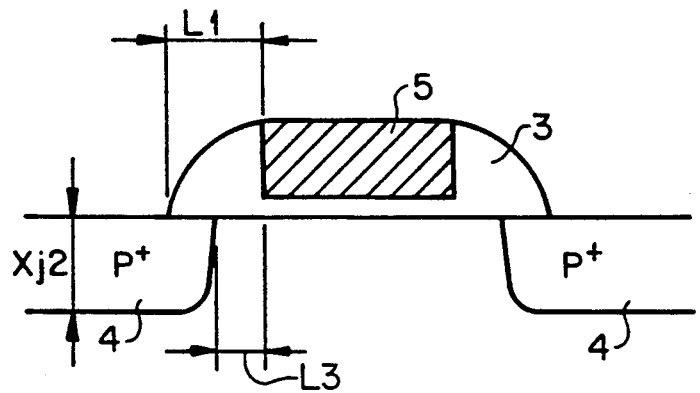
FIG. 2 is a schematic view showing the structure of a PMOS transistor of a single drain structure.
Figure 3A:
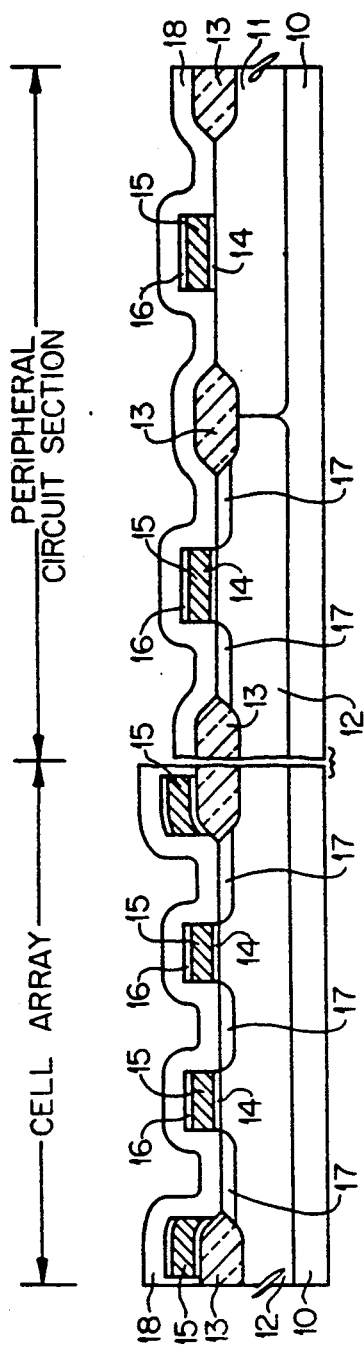
FIGS. 3A to 3C show the conventional method for manufacturing a 16 Mbit DRAM device.

Referring to FIG. 3A, an n-well 11 and a p-well 12 are each formed within a silicon substrate 10, followed by the formation of a field oxide film 13 by the conventional LOCOS method to define active regions. Then, a gate electrode pattern is created on the silicon substrate 10 by sequentially forming a gate oxide film 14, a first conductive layer 15 composed of a poly silicon, and an oxide film 16, and patterning the above laminated films by a photolithography process. After the pattern is formed, an $n^-$ source/drain region 17 is formed by implanting $n^-$ impurity ions into the p-well region 12. After the ion-implantation process, a high temperature oxide film (HTO film) 18 is formed over the whole resultant surface to a predetermined thickness, i.e., a thickness which prevents the silicon pitting generated by subsequent processing.

Figure 3B:
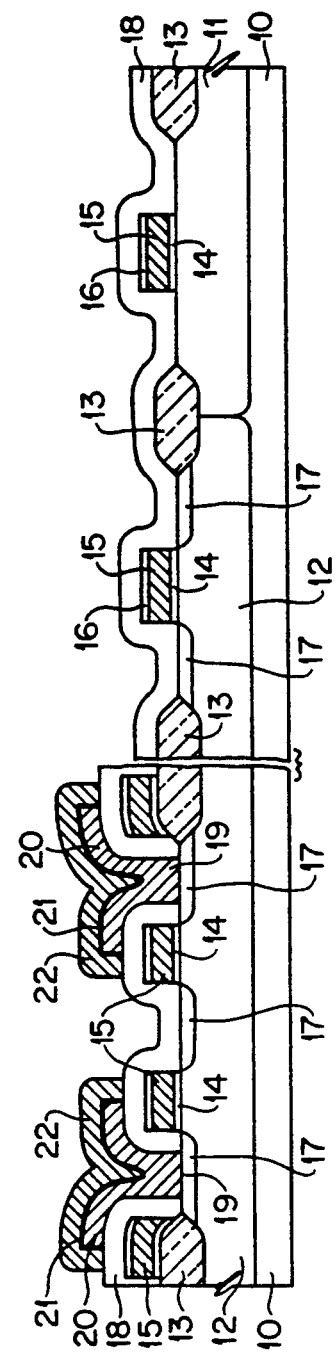

Referring to FIG. 3B, a storage node contact hole 19 is formed in the HTO film in the cell array section, followed by forming a second conductive layer 20 which acts as the capacitor storage node pattern. Then, a capacitor insulating film 21 (a laminated film of oxide/nitride/oxide or nitride/oxide), covers the whole surface, on top of which follows a third conductive layer, forming the capacitor's plate electrode pattern. The cell array capacitors are now complete. However, as is described above, since etching processes for the formation of the cell capacitors are subsequent to the layering of the HTO film 18, it should be of a sufficient thickness to protect the silicon substrate.

Figure 3C:
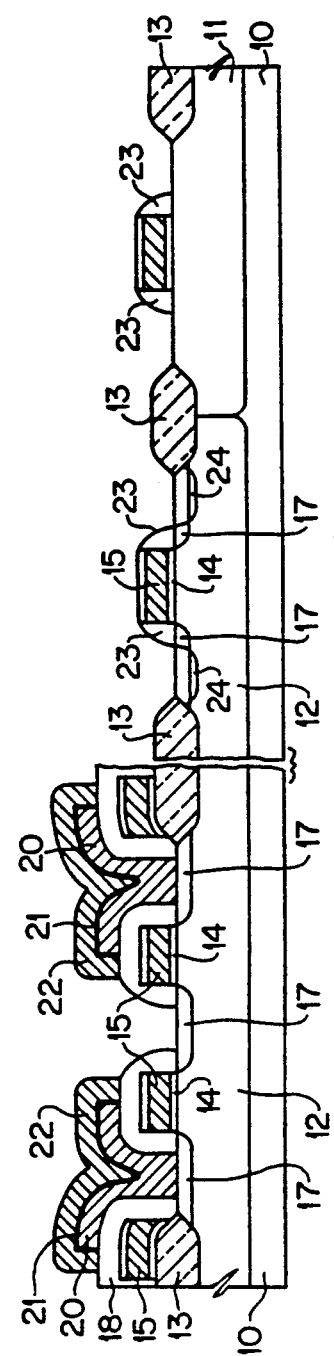

After capacitor formation, FIG. 3C shows spacers 23 composed of HTO remaining on the side walls of first conductive layer 15, resulting from anisotropically etching the HTO film of the peripheral circuit section. An n+ impurity doping region 24 is formed within the p-well region 12, using side wall spacers 23 as an ion-implantation mask. Accordingly, since the HTO film has kept a sufficient thickness as previously stated, the width of the HTO-film side wall spacers 23 formed in the peripheral circuit section is determined by the overall HTO film thickness. Since that thickness cannot be thinner than a certain amount, the width of the side wall spacer cannot be reduced. Thus, the n− impurity-doped region 17 of the peripheral circuit transistors becomes undesirably long, thereby reducing their drain current. Moreover, reducing the drain current decreases the transistor's switching speed, which, of course, inhibits high-speed operation of the device.

The present fabrication method to solve the problem of conventional technique will be described with reference to FIGS. 4A–4C.

Figure 4A:
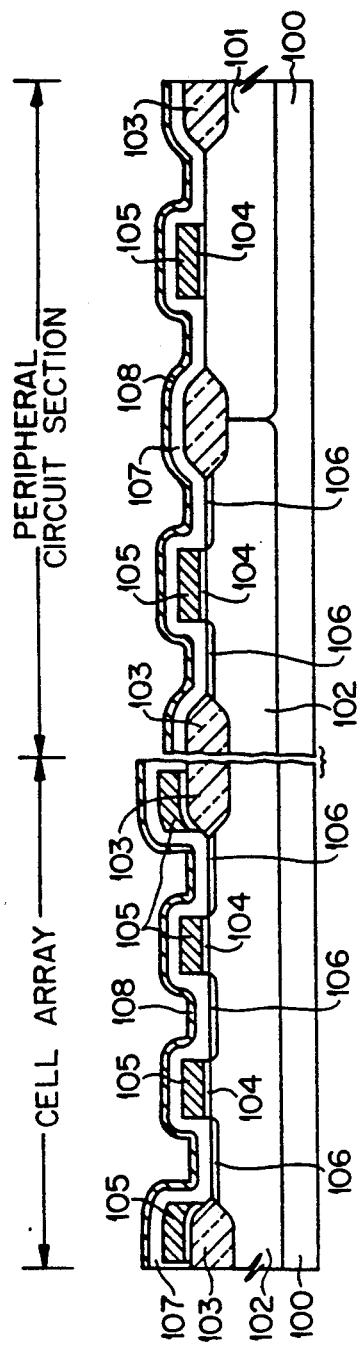
FIGS. 4A to 4C show the method for manufacturing a 16 Mbit DRAM device according to the present invention.

Referring to FIG. 4A, an n-well 101 and a p-well 102 are respectively formed within a first conductive type substrate 100, (for instance, p-type silicon), by an ion-implantation process, and a field oxide film 103 to define an active region is formed on the silicon substrate 100 by a device isolation method such as a LOCOS method. Then, a first conductive layer 105 is formed on the substrate by covering a gate oxide film 104 with a polysilicon, and patterning the polysilicon by the conventional photolithography process. Here, the first conductive layer 105 is provided as the gate electrodes of the access transistors of the cell array and the peripheral circuit transistors. Then, an n− impurity-doped region 106 is formed by implanting n− impurity ions into the superficies of the p-well region.

Then, a thin HTO film 107 of approximately 500 to 1200 Å is covered on the whole surface of substrate, and an insulating film 108, e.g. a nitride film 108, is formed to a thickness of 200 to 500 Å on the HTO film 107. That is, in the present invention, HTO film 107 can be very thin by incorporating nitride film 108 for the protection of the lower structure's surface from the subsequent etching during capacitor formation.

Figure 4B:
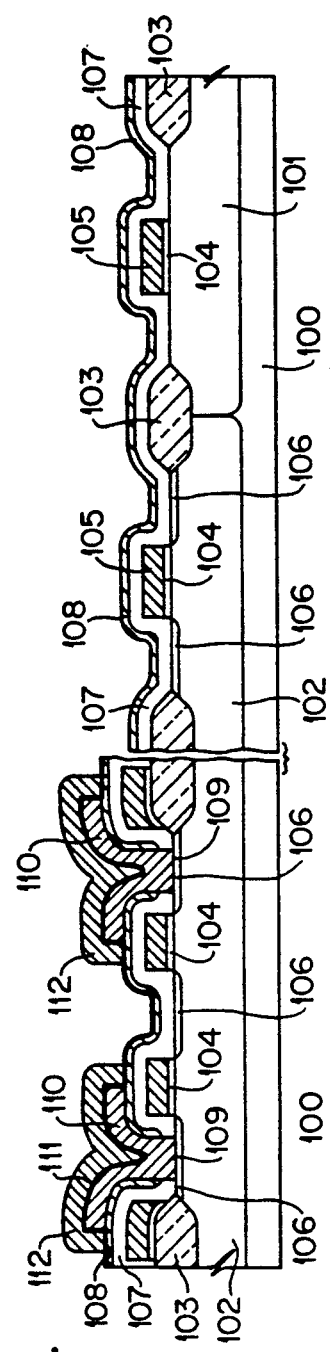

Referring to FIG. 4B, a storage node contact hole 109 is formed in a laminated film composed of the nitride film 108 and HTO film 107 and a polysilicon is covered on the whole surface of substrate. Then, a second conductive layer 110 provided as the storage node of the cell capacitor is formed by patterning the polysilicon by the conventional photolithography process. Then, a capacitor insulating film 111 composed of another laminated film of oxide/nitride/oxide or nitride/oxide is formed on the whole surface of substrate. Then a third conductive layer 112 is formed as the plate electrode of the capacitor by depositing another polysilicon on the capacitor insulating film 111 and patterning the polysilicon by the conventional photolithography process.

Figure 4C:
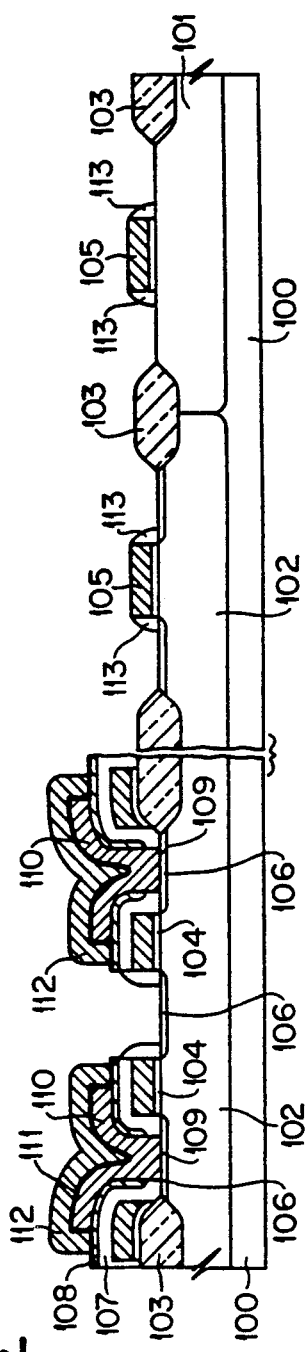

Referring to FIG. 4C, the nitride film 108 used as an etch blocking film during the capacitor formation is removed by a wet removing method. Then, a side wall spacer 113 composed of HTO film is formed on the side walls of first conductive layer 105 of the peripheral circuit section by anisotropically etching the HTO film 107.

Then, a NMOS transistor of LDD structure and a PMOS transistor of single drain structure are formed by the conventional MOS fabrication method. Finally, the devices formed on the substrate are connected to each other by a metal interconnection process, thereby completing a semiconductor memory device.

As described above, according to the present invention, an etch blocking layer such as an nitride film is formed on the HTO film, thereby saving the lower film from pitting during the following etching process. Accordingly, since a HTO film can be formed thinly, the width of the side wall spacers composed of HTO film in the peripheral circuit section can be reduced, which reduces lateral diffusion of the n− impurities below the side wall spacers, and proportionally increases the drain current of the transistors. Furthermore, the operation can be accomplished faster than that of the conventional method.

What is claimed is:

1. A method for manufacturing an ultra-large-scale integrated memory device having a memory cell array section and a peripheral circuit section, said peripheral circuit section including a plurality of transistors formed therein, the method comprising the steps of:

forming an insulating film over the surface of both the memory array section and the peripheral array section;

forming an etch blocking film over said insulating film;

forming capacitors at select locations of said memory cell array section, said insulating film and said etch blocking film preventing deterioration of the underlying surface structure during said capacitor forming step;

removing, after said capacitor forming step, the etch blocking film from the surface of said peripheral array section to expose said insulating film; and forming side wall spacers on the side walls of the gate electrode of said transistors in the peripheral array section by anisotropically etching said insulating film.

2. The method for manufacturing an ultra-large-scale integrated semiconductor memory device as claimed in claim 1, wherein said insulating film is a high temperature oxide film (HTO) and said etch blocking film is a nitride film.

3. The method for manufacturing an ultra-large-scale integrated semiconductor memory device as claimed in claim 2, wherein the thickness of said high temperature oxide film is approximately 500 to 1200 Å.

4. The method for manufacturing an ultra-large-scale integrated semiconductor memory device as claimed in claim 2, wherein the thickness of said nitride film is approximately 200 to 500 Å.

5. A method for manufacturing an ultra-large-scale integrated semiconductor memory device, comprising the steps of:

forming a first conductive layer provided as a word line in a cell array of said memory device having a first conductive-type substrate and provided as the gate electrode of a transistor in a peripheral circuit section of said memory device, by interposing a gate insulating film on said substrate;

forming a lightly doped region of a second conductive type impurity self-aligned to said first conductive layer near the surface of said semiconductor substrate and sequentially laminating a high temperature oxide film and an etch blocking film on the whole resultant surface;

forming a cell capacitor in said cell array by forming a contact hole in said laminated film, and sequentially forming a second conductive layer in contact with said lightly doped region of the second conductive type impurity through the contact hole, interposing a capacitor insulating film and covering the second conductive layer with a third conductive layer;

forming side wall spacers of said high temperature oxide film on the side walls of said first conductive layer arranged in said peripheral circuit section by removing said etch blocking film after said cell capacitor forming step, and anisotropically etching said high temperature oxide film; and forming a heavily doped region of said second conductive type impurity self-aligned to said side wall spacers near the surface of said semiconductor substrate.

6. The method of claim 1, wherein said thin insulating film is an oxide film.

7. The method of claim 1, wherein said etch blocking film is a nitride film.

8. The method of claim 5, wherein said etch blocking film is a nitride film.

9. The method of claim 1, wherein the step of forming side wall spacers by anisotropically etching said exposed insulating film includes removing the insulating film over the top of the underlying gate surface.

10. The method of claim 5, wherein the step of forming side wall spacers by anisotropically etching said exposed insulating film includes removing the insulating film over the top of the underlying gate surface in a peripheral circuit section of said memory device.

* * * * *